(12) United States Patent
Lo et al.

(10) Patent No.: US 11,257,987 B2
(45) Date of Patent: Feb. 22, 2022

(54) STRUCTURE WITH MICRO LIGHT-EMITTING DEVICE

(71) Applicant: PlayNitride Inc., Tainan (TW)

(72) Inventors: Yu-Yun Lo, Tainan (TW); Chih-Ling Wu, Tainan (TW); Yi-Min Su, Tainan (TW)

(73) Assignee: PlayNitride Inc., Hsinchu County (TW)

( * ) Notice: Subject to any disclaimer, the term of this patent is extended or adjusted under 35 U.S.C. 154(b) by 193 days.

(21) Appl. No.: 15/953,509

(22) Filed: Apr. 16, 2018

(65) Prior Publication Data

US 2019/0115503 A1   Apr. 18, 2019

Related U.S. Application Data

(60) Provisional application No. 62/607,325, filed on Dec. 19, 2017.

(30) Foreign Application Priority Data

Oct. 16, 2017   (TW) .................................. 106135277

(51) Int. Cl.
*H01L 21/677* (2006.01)
*H01L 33/48* (2010.01)
*H01L 25/075* (2006.01)
*H01L 33/00* (2010.01)

(52) U.S. Cl.
CPC .......... *H01L 33/483* (2013.01); *H01L 21/677* (2013.01); *H01L 25/0753* (2013.01); *H01L 33/0095* (2013.01)

(58) Field of Classification Search
CPC ............................ H01L 33/483; H01L 21/677
See application file for complete search history.

(56) References Cited

U.S. PATENT DOCUMENTS

| | | | | |
|---|---|---|---|---|
| 2005/0000634 | A1* | 1/2005 | Craig | H01L 24/81 156/230 |
| 2005/0030752 | A1* | 2/2005 | Imai | H01L 33/60 362/267 |
| 2008/0023711 | A1* | 1/2008 | Tarsa | H01L 33/486 257/98 |
| 2013/0077280 | A1* | 3/2013 | Bemmerl | H01L 33/44 361/807 |
| 2013/0279169 | A1* | 10/2013 | Reiherzer | H01L 24/32 362/249.02 |

(Continued)

FOREIGN PATENT DOCUMENTS

| | | |
|---|---|---|
| TW | 201508602 | 3/2015 |
| TW | 201705544 | 2/2017 |

*Primary Examiner* — Kenneth Parker
*Assistant Examiner* — Long H Le
(74) *Attorney, Agent, or Firm* — JCIPRNET

(57) ABSTRACT

A structure with micro light-emitting device includes a substrate, at least one micro light-emitting device, a holding structure, and at least one buffer structure. The micro light-emitting device is disposed on the substrate, and there is a vertical distance between the micro light-emitting device and the substrate. The holding structure is disposed on the substrate and directly contacts the micro light-emitting device. The buffer structure directly contacts the holding structure. Here, a Young's modulus of the buffer structure is smaller than a Young's modulus of the holding structure.

16 Claims, 10 Drawing Sheets

(56) References Cited

U.S. PATENT DOCUMENTS

| | | | | |
|---|---|---|---|---|
| 2015/0353781 A1* | 12/2015 | Namiki | ............... | H01L 33/486 |
| | | | | 257/98 |
| 2016/0093780 A1* | 3/2016 | Beppu | ................. | H01L 33/60 |
| | | | | 257/98 |
| 2016/0144608 A1* | 5/2016 | Chang | ................ | B32B 37/12 |
| | | | | 216/83 |
| 2016/0172253 A1* | 6/2016 | Wu | ..................... | H01L 33/62 |
| | | | | 438/15 |
| 2017/0256522 A1* | 9/2017 | Cok | ................ | H01L 25/0753 |

* cited by examiner

STRUCTURE WITH MICRO LIGHT-EMITTING DEVICE

CROSS-REFERENCE TO RELATED APPLICATION

This application claims the priority benefits of Taiwan application serial no. 106135277, filed on Oct. 16, 2017 and U. S. provisional application Ser. No. 62/607,325, filed on Dec. 19, 2017. The entirety of each of the above-mentioned patent applications is hereby incorporated by reference herein and made a part of this specification.

BACKGROUND OF THE INVENTION

1. Field of the Invention

The invention relates to a semiconductor structure. More specifically, the invention relates to a structure with micro light-emitting device.

2. Description of Related Art

At present, transferring micro light-emitting diodes (LEDs) from a carrier substrate to a receiving substrate is mainly done via forces at distance, such as an electrostatic force or a magnetic force. In general, LEDs are held by a holding structure, so that it is easier to pick up the micro LEDs from the carrier substrate and transport and transfer the micro LEDs to the receiving substrate, and the micro LEDs are secured by the fixing structure, so that the quality of the micro LEDs is not affected by external factors during the transfer. However, because a material of the holding structure is brittle, the holding structure is easily fractured by external forces while the holding structure is holding the micro LEDs during the transportation and transfer, resulting in a decrease in a yield of transporting and transferring the micro LEDs. How to enable the micro holding structure to temporarily hold the micro LEDs and how to transport and transfer the micro LEDs from the carrier substrate to the receiving substrate in an easier and more efficient manner have become an important topic in the industry.

SUMMARY OF THE INVENTION

An embodiment of the invention provides a structure with micro light-emitting device, with at least one buffer structure directly contacting a holding structure, so as to effectively enhance a yield of transporting and transferring micro LEDs.

A structure with micro light-emitting device provided in an embodiment of the invention includes a substrate, at least one micro light-emitting device, a holding structure, and at least one buffer structure. The at least one micro light-emitting device is disposed on the substrate, and a vertical distance exists between the at least one micro light-emitting device and the substrate. The holding structure is disposed on the substrate and directly contacts the at least one micro light-emitting device. The at least one buffer structure directly contacts the holding structure, wherein a Young's modulus of the at least one buffer structure is smaller than a Young's modulus of the holding structure.

In an embodiment of the invention, a maximum amount of deformation of the holding structure is less than the vertical distance between the at least one micro light-emitting device and the substrate.

In an embodiment of the invention, the at least one micro light-emitting device has a first surface and a second surface opposite to each other as well as a peripheral surface connecting the first surface and the second surface, the first surface faces the substrate, the second surface is away from the substrate, and the holding structure extends toward the substrate from the peripheral surface and is disposed on the substrate.

In an embodiment of the invention, a gap is between the holding structure and the substrate, the at least one buffer structure includes a plurality of buffer structures located in the gap between the holding structure and the substrate and directly contacting the substrate and the holding structure, and the at least one micro light-emitting device, the buffer structures, and the substrate define an air gap.

In an embodiment of the invention, the buffer structures directly contact at least a portion of the peripheral surface or/and at least a portion of the first surface of the at least one micro light-emitting device.

In an embodiment of the invention, the holding structure directly contacts the substrate, the at least one buffer structure includes a plurality of buffer structures located between the holding structure and the substrate and directly contacting the substrate and the holding structure, and the at least one micro light-emitting device, the buffer structures, and the substrate define an air gap.

In an embodiment of the invention, the buffer structures directly contact at least a portion of the peripheral surface or/and at least a portion of the first surface of the at least one micro light-emitting device.

In an embodiment of the invention, the structure with micro light-emitting device further includes a stress buffer structure disposed between the at least one micro light-emitting device and the substrate and at least directly contacting the at least one micro light-emitting device, the at least one buffer structure, the substrate, or a combination thereof, an orthogonal projection area of the stress buffer structure on the substrate is smaller than an orthogonal projection area of the at least one micro light-emitting device on the substrate.

In an embodiment of the invention, a Young's modulus of the stress buffer structure is less than the Young's modulus of the at least one buffer structure.

In an embodiment of the invention, the at least one buffer structure directly contacts the holding structure, the substrate, and the at least one micro light-emitting device, and the holding structure, the at least one micro light-emitting device, and the substrate define a configuration area filled with the at least one buffer structure.

In an embodiment of the invention, the holding structure further extends onto at least a portion of the second surface of the at least one micro light-emitting device from the peripheral surface.

In an embodiment of the invention, a ratio of a contact area of the holding structure and the second surface to a surface area of the second surface is within a range from 0.05 to 0.5.

In an embodiment of the invention, the holding structure is successively arranged on the second surface of the at least one micro light-emitting device.

In an embodiment of the invention, the holding structure exposes a portion of the second surface of the at least one micro light-emitting device.

In an embodiment of the invention, a ratio of a first width of the holding structure arranged on the second surface of the at least one micro light-emitting device to a second width of the second surface of the at least one micro light-emitting device is within a range from 0.1 to 0.8.

In an embodiment of the invention, the at least one buffer structure includes a plurality of buffer structures disposed between the holding structure, the at least one micro light-emitting device, and the substrate and directly contacting the holding structure, the at least one micro light-emitting device, and the substrate, and a height of each of the at least one buffer structure on a vertical cross-section is equal to a height of the at least one micro light-emitting device on the vertical cross-section from the second surface to the substrate.

In an embodiment of the invention, the at least one buffer structure includes a plurality of buffer structures covering the holding structure and the substrate, the holding structure is located between the at least one micro light-emitting device and the at least one buffer structure, and the holding structure, the at least one micro light-emitting device, and the substrate define an air gap.

In an embodiment of the invention, the holding structure directly contacts at least a portion of the peripheral surface.

In an embodiment of the invention, a ratio of a contact area of the holding structure and the peripheral surface to a surface area of the peripheral surface is within a range from 0.05 to 0.5.

In an embodiment of the invention, a top surface of the holding structure is aligned to the second surface of the at least one micro light-emitting device.

In an embodiment of the invention, the at least one micro light-emitting device includes two micro light-emitting devices, and the holding structure is located between the micro light-emitting devices.

Based on the above, in the structure with micro light-emitting device provided in an embodiment of the invention, the holding structure is disposed on the substrate and directly contacts the at least one micro light-emitting device, and the at least one buffer structure directly contacts the holding structure, wherein the Young's modulus of the at least one buffer structure is smaller than the Young's modulus of the holding structure. Thereby, when the at least one micro light-emitting device is being transported and transferred between different substrates, the holding structure is able to well hold and support the micro light-emitting device, and good buffering effects on the holding structure may be achieved by the at least one buffer structure.

To make the above features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
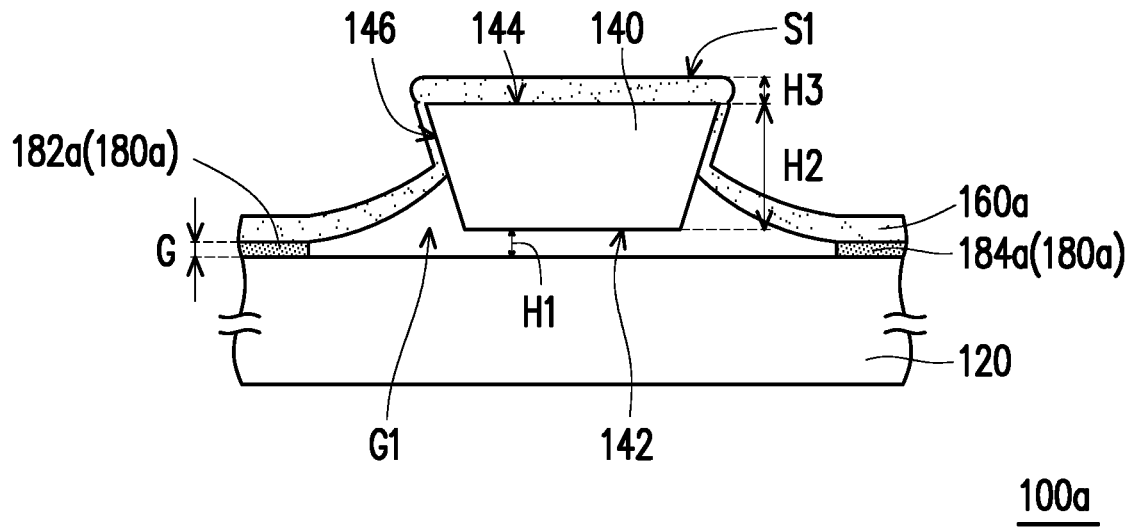
FIG. 1A is a schematic cross-sectional view of a structure with micro light-emitting device according to an embodiment of the invention.
Figure 2A:
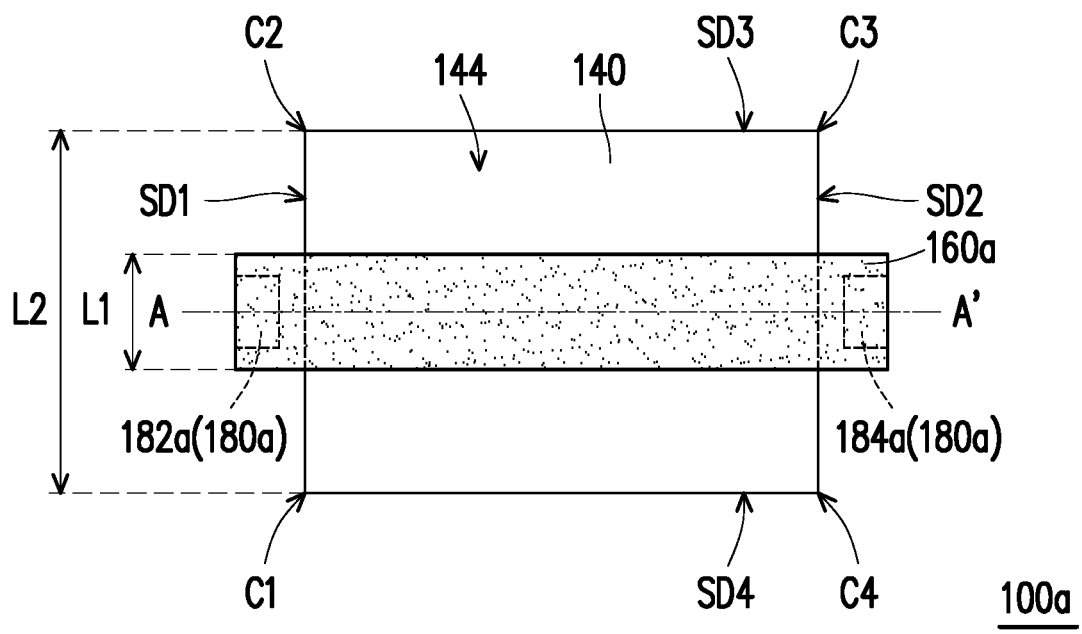
FIG. 2A is a schematic top view of the structure with micro light-emitting device depicted in FIG. 1A.

FIG. 1A is a schematic cross-sectional view of a structure with micro light-emitting device according to an embodiment of the invention. FIG. 2A is a schematic top view of the structure with micro light-emitting device depicted in FIG. 1A. The structure with micro light-emitting device 100*a* in FIG. 1A is depicted along a sectional line A-A' of FIG. 2A, and some components are omitted from FIG. 2A for better illustration. Referring to FIG. 1A, the structure with micro light-emitting device 100*a* provided in an embodiment of the invention includes a substrate 120, at least one micro light-emitting device 140, a holding structure 160*a*, and at least one buffer structure 180*a*. The micro light-emitting device 140 is disposed on the substrate 120, and a vertical distance H1 exists between the micro light-emitting device 140 and the substrate 120. The holding structure 160*a* is disposed on the substrate 120 and directly contacts the micro light-emitting device 140. The buffer structure 180*a* directly contacts the holding structure 160*a*, wherein a Young's modulus of the buffer structure 180*a* is smaller than a Young's modulus of the holding structure 160*a*. Herein, the substrate 120 is a temporary substrate, such as a plastic substrate, a glass substrate, or a sapphire substrate, but the invention is not limited thereto.

In particular, as shown in FIG. 1A, the micro light-emitting device 140 of the embodiment is located on one side of the substrate 120, and the micro light-emitting device 140 has a first surface 142 and a second surface 144 opposite to each other as well as a peripheral surface 146 connecting the first surface 142 and the second surface 144, the first surface 142 faces the substrate 120, and the second surface 144 is away from the substrate 120. Here, the micro light-emitting device 140 may be a horizontal micro light-emitting device, a flip-chip micro light-emitting device, a vertical micro light-emitting device, or other different types of micro light-emitting devices; the form of the micro light-emitting device 140 is not limited in the invention. That is to say, a light-emitting surface (not shown) of the micro light-emitting device 140 may face the substrate 120, or the light-emitting surface of the micro light-emitting device 140 disposed on the substrate 120 may face away from the substrate 120; the invention is not limited thereto. A cross-sectional shape of the micro light-emitting device 140 of the embodiment is, for example, a trapezoidal shape, but the invention is not limited thereto. Herein, a width of the micro light-emitting device 140 is within a range from 1 µm to 100 µm, and a vertical height H2 of the micro light-emitting device 140 is within a range from 1 µm to 6 µm, but the invention is not limited thereto. The embodiment schematically illustrates one micro light-emitting device 140, but the number of the micro light-emitting device 140 disposed on the substrate 120 is not limited in the invention.

Next, referring to both FIG. 1A and FIG. 2A, when viewed from the top of the micro light-emitting device structure 100*a*, the second surface 144 of the micro light emitting device 140 has four edges SD1, SD2, SD3, and SD4 and four corners C1, C2, C3, and C4. In particular, the edge SD1 and the edge SD2 of the second surface 144 of the micro light-emitting device 140 are disposed opposite each other, the edge SD3 and the edge SD4 are disposed opposite each other, and the corner C1 of the micro light-emitting device 140 is constituted by intersecting the edge SD1 and the edge SD4, the corner C2 is constituted by intersecting the edge SD1 and the edge SD3, the corner C3 is constituted by intersecting the edge SD2 and the edge SD3, and the corner C4 is constituted by intersecting the edge SD2 and the edge SD4. In other words, a line connecting the corner C1 and the corner C3 overlaps one diagonal line on the second surface 144 of the micro light-emitting device 140, and a line connecting the corner C2 and the corner C4 overlaps the other diagonal line on the second surface 144 of the micro light-emitting device 140. The micro light-emitting device 140 of the embodiment has a rectangular outline when viewed from the top, but the invention is not limited thereto. In other embodiments not shown in the drawings, the outline of the micro light-emitting device viewed from the top may be circular, trapezoidal, or in other appropriate shapes.

Referring again to both FIG. 1A and FIG. 2A, the holding structure 160a of the embodiment extends toward the substrate 120 from the peripheral surface 146 of the micro light-emitting device 140 and is disposed on the substrate 120, and a gap G exists between the holding structure 160a and the substrate 120. Herein, the holding structure 160a of the embodiment further extends onto the second surface 144 of the micro light-emitting device 140 from the peripheral surface 146 of the micro light-emitting device 140, and, when viewed from the top, the holding structure 160a successively crosses over the opposite edges SD1 and SD2 of the second surface 144 of the micro light-emitting device 140. The holding structure 160a passes through a center of the second surface 144 of the micro light-emitting device 140 and is symmetrically arranged with respect to the center of the micro light-emitting device 140. However, in other embodiments not shown in the drawings, the holding structure may also be symmetrically arranged with respect to the center of the structure with micro-light emitting device but arranged in a different manner or arranged asymmetrically. As long as the holding structure is able to hold and support the micro light-emitting device in a balanced way and smoothly and efficiently transport and transfer the micro light-emitting device in a subsequent manufacturing process, the holding structure falls within the scope of the invention. Herein, the holding structure 160a has a rectangular outline when viewed from the top, but in other embodiments not shown in the drawings, depending on an actual design that is needed, the outline of each of the holding structures when viewed from the top may be polygonal, semicircular, semi-elliptical, or in other shapes that are sufficient to hold the micro light-emitting device; the invention is not limited thereto.

Herein, a ratio of a contact area of the holding structure 160a and the second surface 144 to a surface area of the second surface 144 is within a range from 0.05 to 0.5. In detail, if the ratio is less than 0.05, a supporting capacity of the holding structure 160a to support the micro light-emitting device 140 may be insufficient, resulting in a decrease in a yield of transporting and transferring the micro light-emitting device 140; if the ratio is greater than 0.5, a difficulty of separating the micro light-emitting device 140 from the holding structure 160a in a subsequent manufacturing process is increased. A vertical height H3 from a top surface S1 of the holding structure 160a to the second surface 144 of the micro light-emitting device 140 is, for example, within a range from 0.1 μm to 2 μm. In an embodiment of the invention, a ratio of the vertical height H3 that is from the top surface S1 of the holding structure 160a to the second surface 144 of the micro light-emitting device 140 to the vertical height H2 of the micro light-emitting device 140 is less than or equal to 0.3. In detail, if the ratio is greater than 0.3, the difficulty of separating the micro light-emitting device 140 from the holding structure 160a in the subsequent manufacturing process is increased. The holding structure 160a provided in the embodiment also directly contacts a portion of the peripheral surface 146 of the micro light-emitting device 140. In an embodiment of the invention, a ratio of a contact area of the holding structure 160a and the peripheral surface 146 to a surface area of the peripheral surface 146 is within a range from 0.05 to 0.5. In detail, if the ratio is less than 0.05, the supporting capacity of the holding structure 160a to support the micro light-emitting device 140 may be insufficient, resulting in the decrease in the yield of transporting and transferring the micro light-emitting device 140; if the ratio is greater than 0.5, the difficulty of separating the micro light-emitting device 140 from the holding structure 160a in the subsequent manufacturing process is increased. In particular, a ratio of a width of the holding structure 160a at the edge SD1 (or SD2) of the first surface 142 of the light-emitting device 140 to a width of the edge SD1 (or SD2) of the first surface 142 of the light-emitting device 140 is within a range from 0.05 to 0.6. In detail, if the ratio is less than 0.05, a supporting capacity of the holding structure 160a to support the micro light-emitting device 140 may be insufficient, resulting in a decrease in a yield of transporting and transferring the micro light-emitting device 140; if the ratio is greater than 0.6, a difficulty of separating the micro light-emitting device 140 from the holding structure 160a in a subsequent manufacturing process is increased.

Referring to FIG. 1A, in the embodiment, the number of the buffer structure 180a is embodied as being plural, particularly two buffer structures 182a and 184a. The buffer structures 182a and 184a are disposed on the substrate 120, located in the gap G between the holding structure 160a and the substrate 120, and directly contacting the holding structure 160a and the substrate 120. Particularly, the holding structure 160a of the embodiment does not directly contact the substrate 120, and an orthogonal projection of the holding structure 160a on the substrate 120 overlaps an orthogonal projection of the buffer structures 182a and 184a on the substrate 120, such that the holding structure 160a, the substrate 120, the micro light-emitting device 140, and the buffer structures 182a and 184a to define an air gap G1. Herein, the orthogonal projection of the buffer structures 182a and 184a on the substrate 120 does not overlap at all an orthogonal projection of the micro light-emitting device 140 on the substrate 120. Particularly, the buffer structures 182a and 184a do not directly contact the micro light-emitting device 140. Therefore, the buffer structures 182a and 184a are not only able to absorb external forces exerted on the holding structure 160a holding the micro light-emitting device 140 during the process of transporting and transferring the micro light-emitting device 140 to increase a yield of transporting and transferring the micro light-emitting device 140 but also able to be of no influence on a yield of picking up the micro light-emitting device 140.

In addition, it should be noted that a Young's modulus of the micro light-emitting device 140 is greater than the Young's modulus of the holding structure 160a, and the Young's modulus of the buffer structure 180a is smaller than the Young's modulus of the holding structure 160a. Therefore, rigidity of the holding structure 160a contributes to holding and supporting the micro light-emitting device 140, and ductility of the buffer structure 180a may achieve good buffering effects on the holding structure 160a, so as to prevent the holding structure 160a from being fractured because of the influence of external forces when the holding structure 160a holds and supports the micro light-emitting device 140 during the process of transporting and transferring the micro light-emitting device 140. In short, in the embodiment, the holding structure 160a is able to provide good holding and support due to the composite structure constituted by the buffer structure 180a and the holding structure 160a, so as to facilitate the transportation and transfer of the micro light-emitting device 140 between different substrates.

Herein, a material of the buffer structure 180a is different from a material of the holding structure 160a, wherein a material of the buffer structures 182a and 184a may be a polymer organic material having better strength to achieve a buffering effect to protect the holding structure 160a that holds and supports the micro light-emitting device 140 from being affected by external forces during the process of transporting and transferring the micro light-emitting device 140, thereby preventing the holding structure 160a from being fractured because of the influence of external factors. The material of the holding structure 160a may be an inorganic material, such as silicon dioxide or silicon nitride, which can withstand high temperature and high pressure during the manufacturing process, wherein a thickness of the holding structure 160a on a vertical cross-section is within a range from 0.1 µm to 2 µm, so as to achieve both holding and supporting effects. In addition, a connection force between the holding structure 160a and the micro light-emitting device 140 is greater than a connection force between the holding structure 160a and the substrate 120, and a connection force between the buffer structure 180a and the holding structure 160a is greater than a connection force between the buffer structure 180a and the substrate 120, so that the micro light emitting device 140 may have good performance when being transported and transferred.

In the embodiment, when the structure with micro light-emitting device 100a is affected by external forces during its transportation and transfer, an amount of deformation of the buffer structure 180a is greater than an amount of deformation of the holding structure 160a, and the amount of deformation of the holding structure 160a is less than the maximum amount of deformation of the holding structure 160a, so as to absorb the impact of the external forces on the holding structure 160a. The maximum amount of deformation of the holding structure 160a is less than the vertical distance H1 between the micro light-emitting device 140 and the substrate 120, so as to facilitate the subsequent pick-up process.

The reference numerals and a part of the contents in the previous embodiment are used in the following embodiments, in which identical reference numerals indicate identical or similar components, and repeated descriptions of the same technical contents are omitted. For a detailed description of the omitted parts, reference can be found in the previous embodiment(s), and no repeated description is provided in the following embodiments.

Figure 1B:
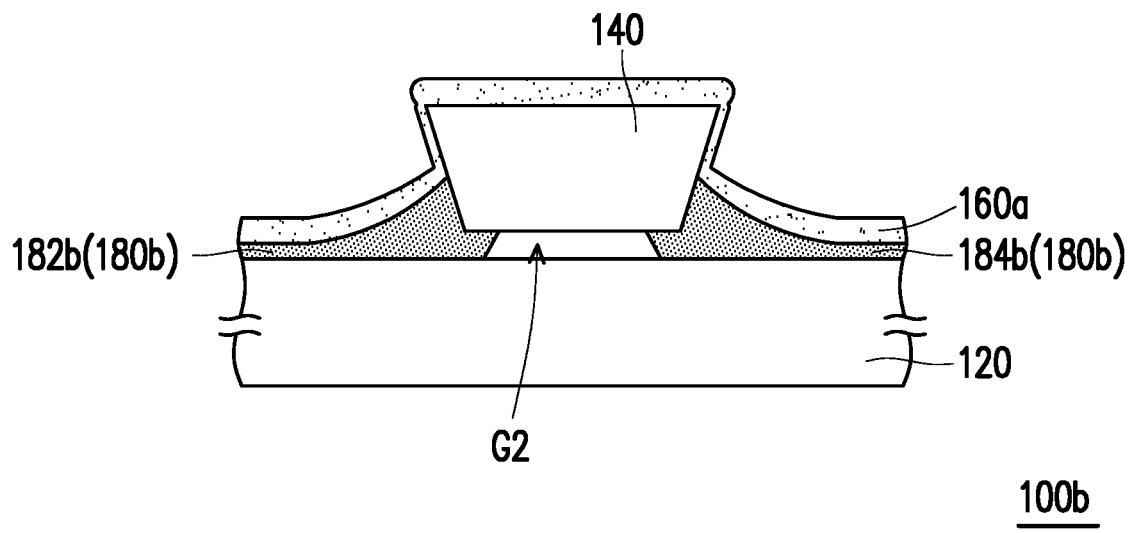
FIG. 1B to FIG. 1H are schematic cross-sectional views of a structure with micro light-emitting device according to several embodiments of the invention.

FIG. 1B is a schematic cross-sectional view of a structure with micro light-emitting device according to another embodiment of the invention. Referring to both FIG. 1A and FIG. 1B, a structure with micro light-emitting device 100b of the embodiment is similar to the structure with micro light-emitting device 100a of FIG. 1A, and the difference therebetween is as follows: a buffer structure 180b of the embodiment further directly contacts the micro light-emitting device 140. Particularly, buffer structures 182b and 184b directly contact a portion of the first surface 142 and a portion of the peripheral surface 146 respectively and are located between the substrate 120 and the micro light-emitting device 140. Herein, the micro light-emitting device 140, the buffer structures 182b and 184b, and the substrate 120 define an air gap G2. It is worth mentioning that in the embodiment, a contact area of the buffer structure 180b and the holding structure 160a is greater than a contact area of the buffer structure 180b and the substrate 120, and the contact area of the buffer structure 180b and the holding structure 160a is also greater than a contact area of the buffer structure 180b and the micro light-emitting device 140. That is to say, the contact area of the buffer structure 180b and the holding structure 160a is greater than the contact area of the buffer structure 180b and the substrate 120 greater than the contact area of the buffer structure 180b and the micro light-emitting device 140, so that a stress exerted on the holding structure 160a may be sufficiently buffered by the buffer structure 180b, and an effect of the stress may be transferred to the buffer structure 180b.

Figure 1C:
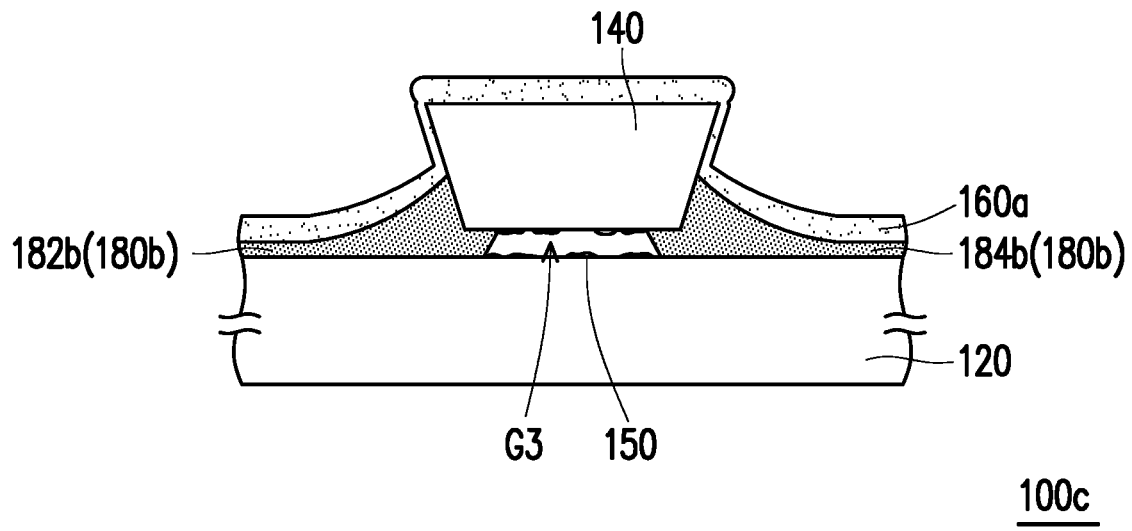

FIG. 1C is a schematic cross-sectional view of a structure with micro light-emitting device according to another embodiment of the invention. Referring to both FIG. 1B and FIG. 1C, a structure with micro light-emitting device 100c of the embodiment is similar to the structure with micro light-emitting device 100b of FIG. 1B, and the difference therebetween is as follows: the structure with micro light-emitting device 100c of the embodiment further includes a stress buffer structure 150 disposed between the micro light-emitting device 140 and the substrate 120. Particularly, the stress buffer structure 150 is disposed in an air gap G3 formed among the substrate 120, the micro light-emitting device 140, and the buffer structure 180b. More specifically, an orthogonal projection area of the stress buffer structure 150 on the substrate 120 is smaller than an orthogonal projection area of the micro light-emitting device 140 on the substrate 120. Herein, the stress buffer structure 150 at least directly contacts the substrate 120, the micro light-emitting device 140, the buffer structure 180b, or a combination thereof. Herein, the stress buffer structure 150 absorbs a stress generated when the micro light-emitting device 140 is bonded to the substrate 120, thereby increasing a bonding yield. In other words, the stress buffer structure 150 may provide a stress buffering effect between the micro light-emitting device 140 and the substrate 120. In an embodiment of the invention, a Young's modulus of the stress buffer structure 150 is less than a Young's modulus of the buffer structure 180b. Herein, a material of the stress buffer structure 150 includes a foam material or an organic polymer material, causing the stress buffer structure 150 to have a plurality of irregular air holes, wherein a porosity of the stress buffer structure 150 made of the foam material is equal to or greater than 50%, and therefore good buffering effects may be achieved.

Figure 1D:
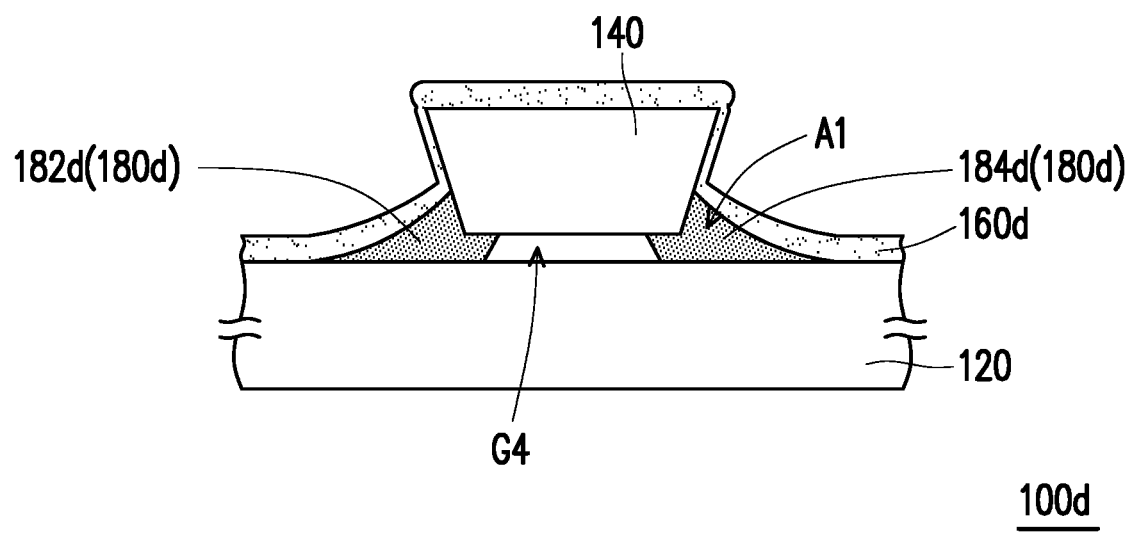

FIG. 1D is a schematic cross-sectional view of a structure with micro light-emitting device according to another embodiment of the invention. Referring to both FIG. 1B and FIG. 1D, a structure with micro light-emitting device 100d of the embodiment is similar to the structure with micro light-emitting device 100b of FIG. 1B, and the difference therebetween is as follows: a holding structure 160d of the embodiment directly contacts the substrate 120. The number of the buffer structure 180d is two according to the present embodiment, i.e., buffer structures 182d and 184d, and the buffer structures 182d and 184d directly contact the substrate 120, the holding structure 160*d*, and the micro light-emitting device 140. The holding structure 160*d*, the micro light-emitting device 140, and the substrate 120 define a configuration area A1, and the buffer structures 182*d* and 184*d* are disposed on the substrate 120 and located within the configuration area A1. Here, the buffer structures 182*d* and 184*d*, the micro light-emitting device 140, and the substrate 120 define an air gap G4.

Figure 1E:
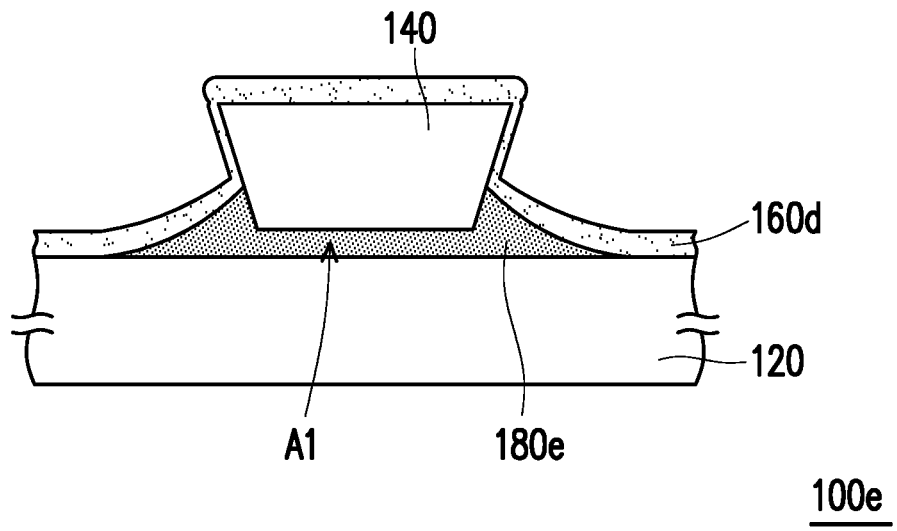

FIG. 1E is a schematic cross-sectional view of a structure with micro light-emitting device according to another embodiment of the invention. Referring to both FIG. 1D and FIG. 1E, a structure with micro light-emitting device 100*e* of the embodiment is similar to the micro light-emitting device structure 100*d* of FIG. 1D, and the difference therebetween is as follows: the buffer structure 180*e* of the embodiment is disposed on the substrate 120 and fills the configuration area A1.

Figure 1F:
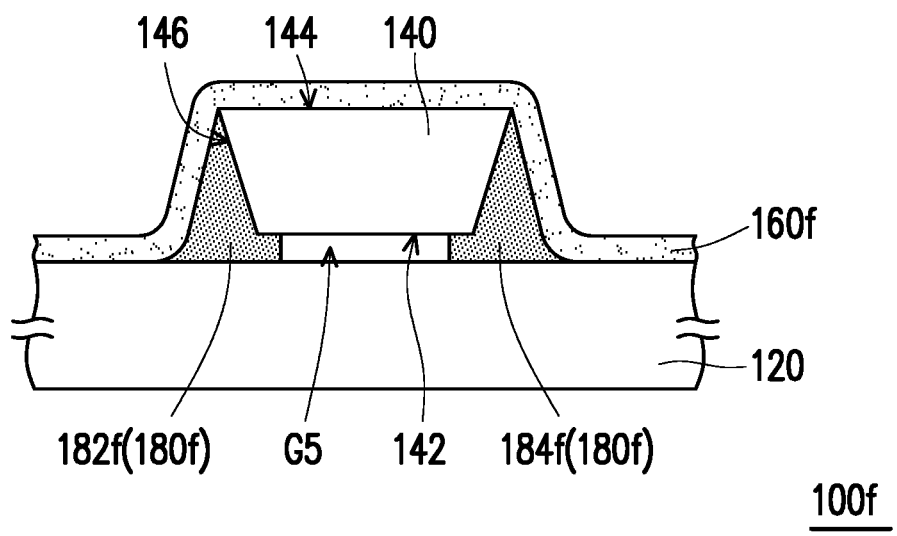

FIG. 1F is a schematic cross-sectional view of a structure with micro light-emitting device according to another embodiment of the invention. Referring to both FIG. 1D and FIG. 1F, a structure with micro light-emitting device 100*f* of the embodiment is similar to the structure with micro light-emitting device 100*d* of FIG. 1D, and the difference therebetween is as follows: a holding structure 160*f* of the embodiment only contacts the second surface 144 of the micro light-emitting device 140 directly. The number of the buffer structure 180*f* is embodied as two, i.e., buffer structures 182*f* and 184*f*, and the buffer structures 182*f* and 184*f* cover the peripheral surface 146 of the micro light-emitting device 140. The holding structure 160*f* is disposed on the buffer structure 180*f* and directly connects the buffer structure 180*f* and the substrate 120, and the buffer structure 180*f*, the micro light-emitting device 140, and the substrate 120 define an air gap G5. Particularly, a height of the buffer structures 182*f* and 184*f* on a vertical cross-section is equal to a height of the micro light-emitting device 140 on the vertical cross-section from the second surface 144 to the substrate 120. The micro light-emitting device 140 of the embodiment is trapezoidal. Since the buffer structure 180*f* is further disposed on the peripheral surface 146 of the micro light-emitting device 140, an influence resulting from the shape of the micro light-emitting device 140 may be lessened, the holding structure 160*f* may be protected from being fractured during the manufacturing process, and the production yield of arranging the holding structure 160*f* on the micro light-emitting device 140 may be improved.

Figure 1G:
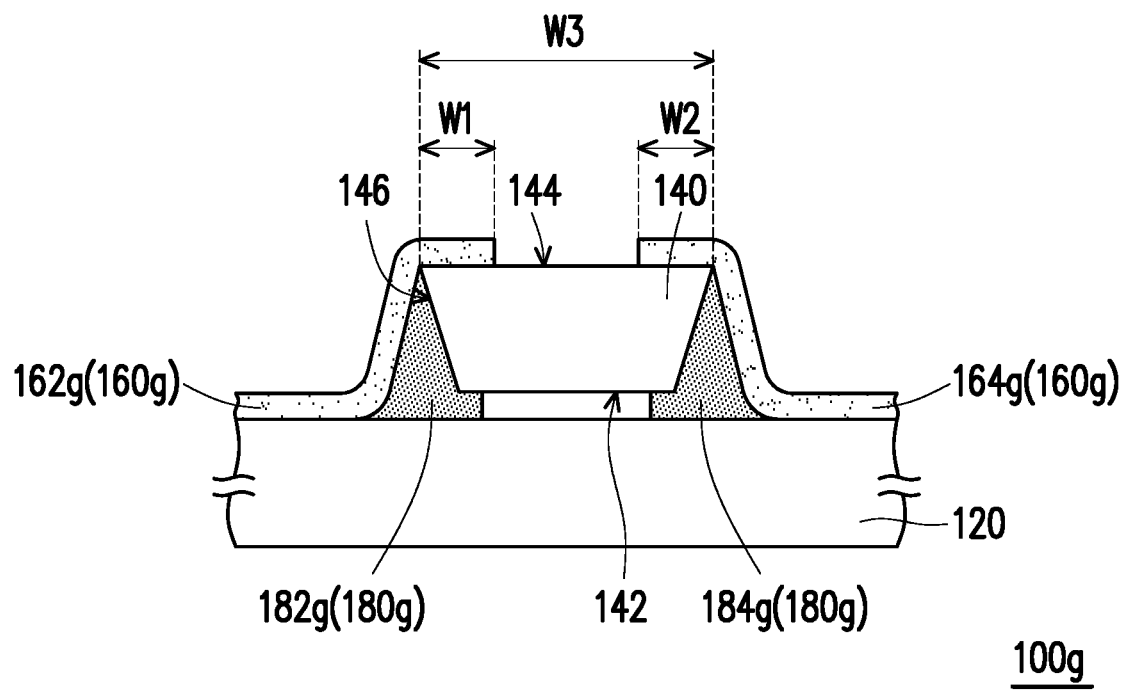
Figure 2B:
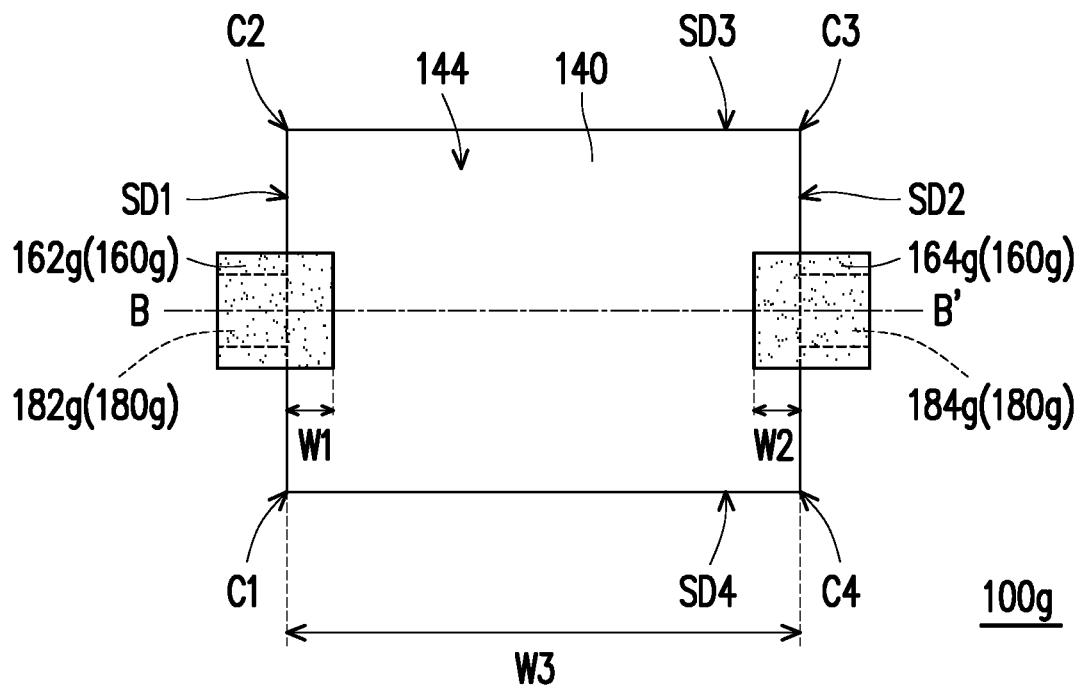
FIG. 2B is a schematic top view of the structure with micro light-emitting device depicted in FIG. 1G.

FIG. 1G is a schematic cross-sectional view of a structure with micro light-emitting device according to another embodiment of the invention. FIG. 2B is a schematic top view of the structure with micro light-emitting device depicted in FIG. 1G. The structure with micro light-emitting device 100*g* of FIG. 1G is depicted along a sectional line B-B' of FIG. 2B, and some components are omitted from FIG. 2B so as to facilitate explanation. Referring to both FIG. 1F and FIG. 1G, a structure with micro light-emitting device 100*g* of the embodiment is similar to the structure with micro light-emitting device 100*f* of FIG. 1F, and the difference therebetween is as follows: a holding structure 160*g* of the embodiment exposes a portion of the second surface 144 of the micro light-emitting device 140. The number of the holding structure 160*g* is two according to the present embodiment, i.e., sub-holding structures 162*g* and 164*g*, wherein a first width of the holding structure 160*g* on the second surface 144 is a total width of a width W1 of the sub-holding structure 162*g* on the second surface 144 and a width W2 of the sub-holding structure 164*g* on the second surface 144. A ratio of the first width of the holding structure 160*g* on the second surface 144 to a second width W3 of the second surface 144 is within a range from 0.1 to 0.8. In detail, if the ratio is less than 0.1, a supporting capacity of the holding structure 160*g* to support the micro light-emitting device 140 may be insufficient, resulting in a decrease in a yield of transporting and transferring the micro light-emitting device 140; if the ratio is greater than 0.8, a difficulty of separating the micro light-emitting device 140 from the holding structure 160*g* in a subsequent manufacturing process is increased. In the embodiment, the ratio of the first width of the holding structure 160*g* on the second surface 144 to the second width W3 of the second surface 144 is about 0.5, but the invention is not limited thereto.

Particularly, referring to both FIG. 1G and FIG. 2B, when viewed from the top, the sub-holding structures 162*g* and 164*g* partially cover and directly contact the opposite edges SD1 and SD2 of the second surface 144 of the micro light-emitting device 140, respectively. A distance from the sub-holding structure 162*g* to a center of the second surface 144 of the micro light-emitting device 140 is equal to a distance from the sub-holding structure 164*g* to the center of the second surface 144 of the micro light-emitting device 140. That is to say, the sub-holding structures 162*g* and 164*g* are symmetrically arranged with respect to the center of the micro light-emitting device 140. Therefore, the sub-holding structures 162*g* and 164*g* are able to hold and support the micro light-emitting device in a balanced way and smoothly and efficiently transport and transfer the micro light-emitting device in a subsequent manufacturing process.

Figure 1H:
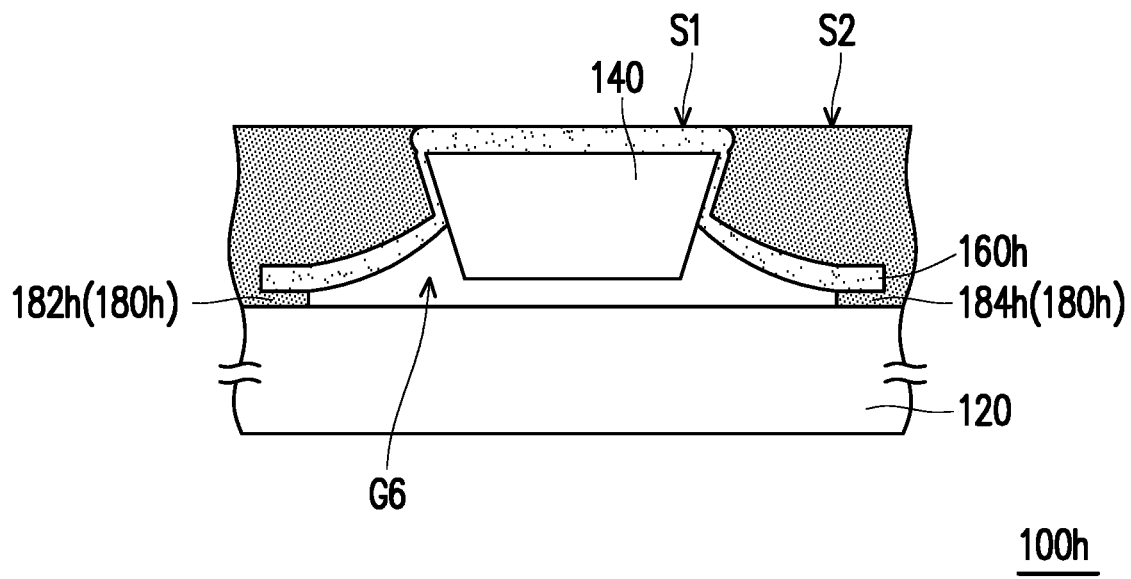

FIG. 1H is a schematic cross-sectional view of a structure with micro light-emitting device according to another embodiment of the invention. Referring to both FIG. 1A and FIG. 1H, a structure with micro light-emitting device 100*h* of the embodiment is similar to the structure with micro light-emitting device 100*a* of FIG. 1A, and the difference therebetween is as follows: the number of the buffer structure 180*h* of the embodiment is embodied as being plural, particularly two buffer structures 182*h* and 184*h*, wherein the buffer structures 182*h* and 184*h* are disposed on the substrate 120 and cover a holding structure 160*h*. In detail, the buffer structures 182*h* and 184*h* are located between the holding structure 160*h* and the substrate 120 and extend over and cover the holding structure 160*h* in a direction away from the substrate 120. Here, the buffer structures 182*h* and 184*h* directly contact the substrate 120 and the holding structure 160*h*. The holding structure 160*h*, the micro light-emitting device 140, the buffer structures 182*h* and 184*h*, and the substrate 120 define an air gap G6, and the top surface S1 of the holding structure 160*h* is aligned to a top surface S2 of the buffer structure 180*h*. In other embodiments not shown, the buffer structure may cover the holding structure and not directly contact the substrate. Here, the holding structure directly contacts the substrate, and the holding structure, the micro light-emitting device, and the substrate define an air gap.

Figure 1I:
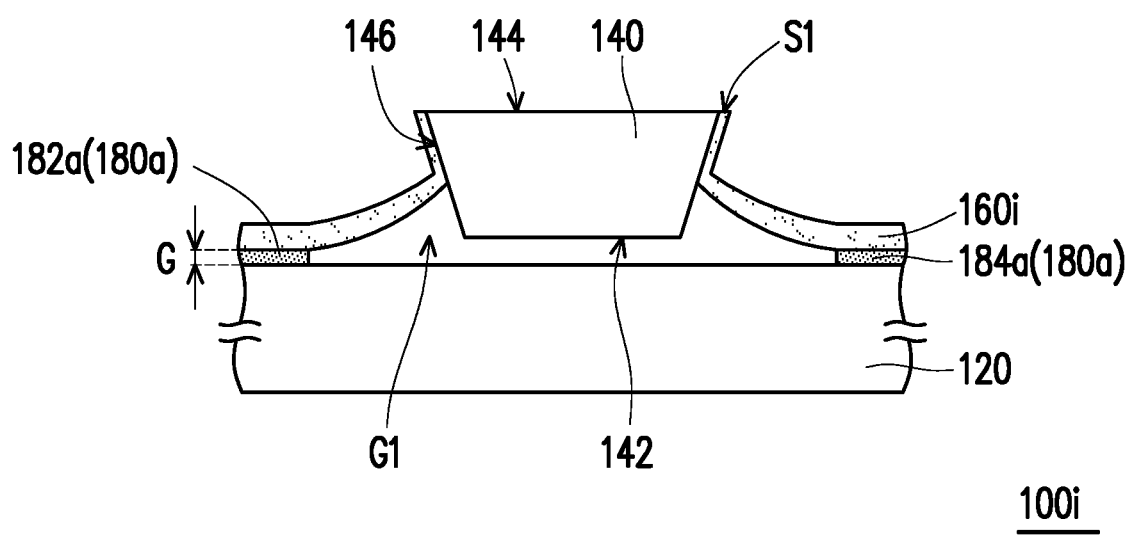
FIG. 1I is a schematic cross-sectional view of a structure with micro light-emitting device according to another embodiment of the invention.

FIG. 1I is a schematic cross-sectional view of a structure with micro light-emitting device according to another embodiment of the invention. Referring to both FIG. 1I and FIG. 1A, a structure with micro light-emitting device 100*i* of the embodiment is similar to the structure with micro light-emitting device 100*a* of FIG. 1A, and the difference therebetween is as follows: the top surface S1 of a holding structure 160*i* of the embodiment is aligned to the second surface 144 of the micro light-emitting device 140. In detail, the holding structure 160*i* only contacts the peripheral surface 146 of the micro light-emitting device 140 and does not contact the second surface 144 of the micro light-emitting device 140. Thereby, when the micro light-emitting device is picked up from the second surface via a transfer head (not shown) and transported and transferred to a different substrate, the micro light-emitting device may have a greater pick-up area, and the holding structure may also accomplish good holding and supporting effects.

Figure 2C:
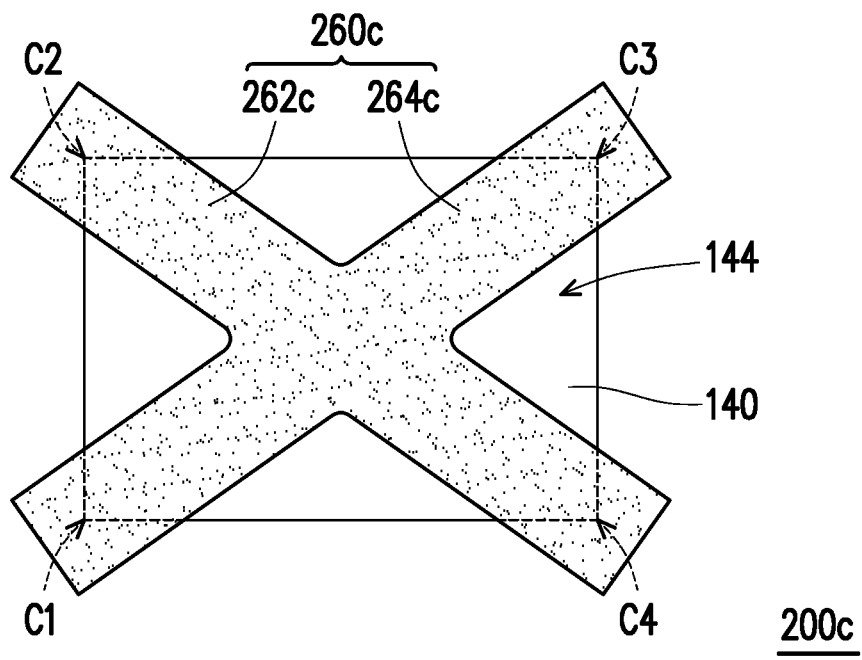
FIG. 2C to FIG. 2H are schematic top views of a structure with micro light-emitting device according to several embodiments of the invention.

Some components (i.e. buffer structures) are omitted from FIG. 2C to FIG. 2H and FIG. 2I so as to facilitate explanation. FIG. 2C is a schematic top view of a structure with micro light-emitting device according to another embodiment of the invention. Referring to both FIG. 2A and FIG. 2C, a structure with micro light-emitting device 200c of the embodiment is similar to the structure with micro light-emitting device 100a of FIG. 2A, and the difference therebetween is as follows: the number of a holding structure 260c of the embodiment is embodied as being plural, e.g., two sub-holding structures 262c and 264c, wherein the sub-holding structures 262c and 264c respectively lie across two diagonal lines of the second surface 144 of the micro light-emitting device 140 when viewed from the top. The sub-holding structure 262c covers and directly contacts the corner C2 and the corner C4 of the second surface 144 of the micro light-emitting device 140, and the sub-holding structure 264c covers and directly contacts the corner C1 and the corner C3 of the second surface 144 of the micro light-emitting device 140.

Figure 2D:
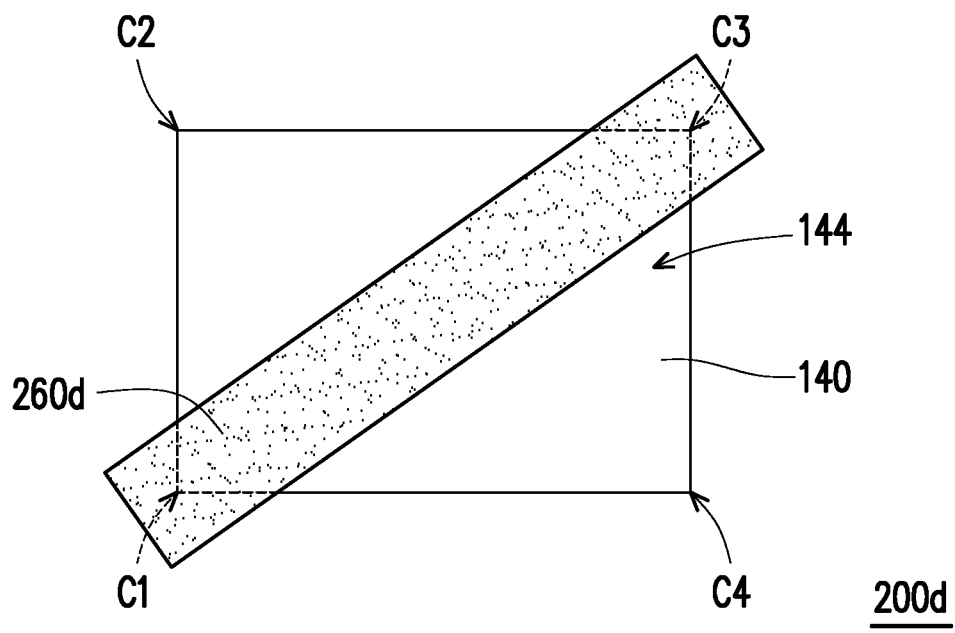

FIG. 2D is a schematic top view of a structure with micro light-emitting device according to another embodiment of the invention. Referring to both FIG. 2C and FIG. 2D, a structure with micro light-emitting device 200d of the embodiment is similar to the structure with micro light-emitting device 200c of FIG. 2C, and the difference therebetween is as follows: a holding structure 260d of the embodiment only lies across one diagonal line of the micro light-emitting device 140 and directly contacts and covers the corners C1 and C3 of the second surface 144 of the micro light-emitting device 140. However, in other embodiments not shown in the drawings, the holding structure 260d may also lie across the corners C2 and C4 of the other diagonal line of the micro light-emitting device 140, and such holding structure still falls within the scope of the invention.

Figure 2E:
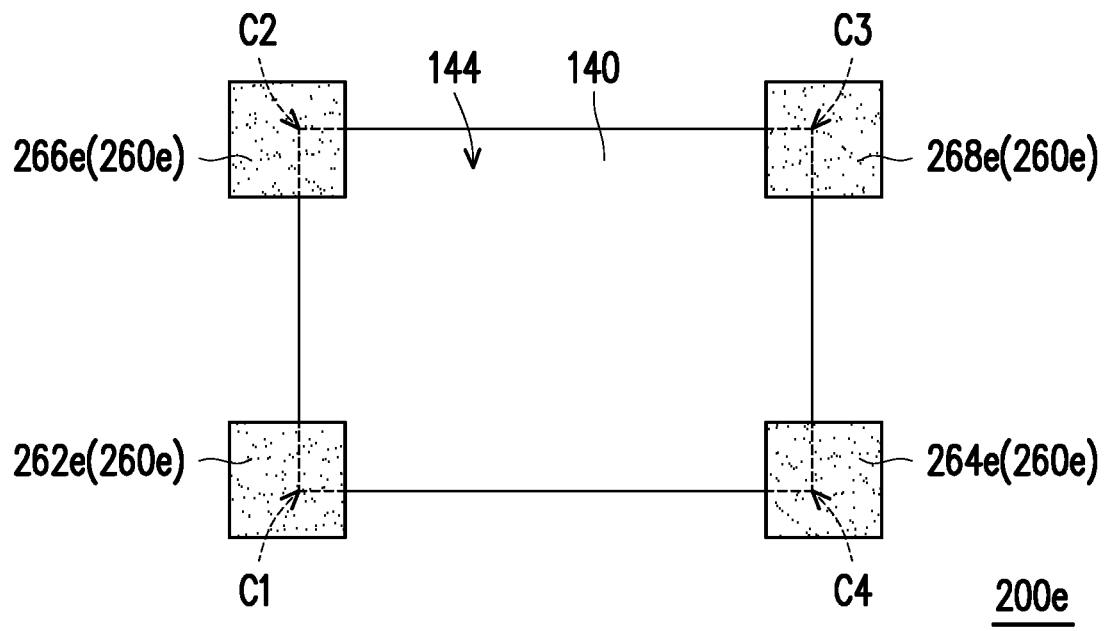

FIG. 2E is a schematic top view of a structure with micro light-emitting device according to another embodiment of the invention. Referring to both FIG. 2B and FIG. 2E, a structure with micro light-emitting device 200e of the embodiment is similar to the structure with micro light-emitting device 100g of FIG. 2B, and the difference therebetween is as follows: a holding structure 260e of the embodiment includes four sub-holding structures 262e, 264e, 266e, and 268e; when viewed from the top, the sub-holding structures 262e, 264e, 266e, and 268e are separately disposed at the four corners C1, C2, C3, and C4 of the second surface 144 of the micro light-emitting device 140. Particularly, the sub-holding structure 262e covers and directly contacts the corner C1, the sub-holding structure 264e covers and directly contacts the corner C4, the sub-holding structure 266e covers and directly contacts the corner C2, and the sub-holding structure 268e covers and directly contacts the corner C3. Here, the sub-holding structures 262e, 264e, 266e, and 268e are symmetrically and equidistantly arranged with respect to the center of the second surface 144 of the micro light-emitting device 140.

Figure 2F:
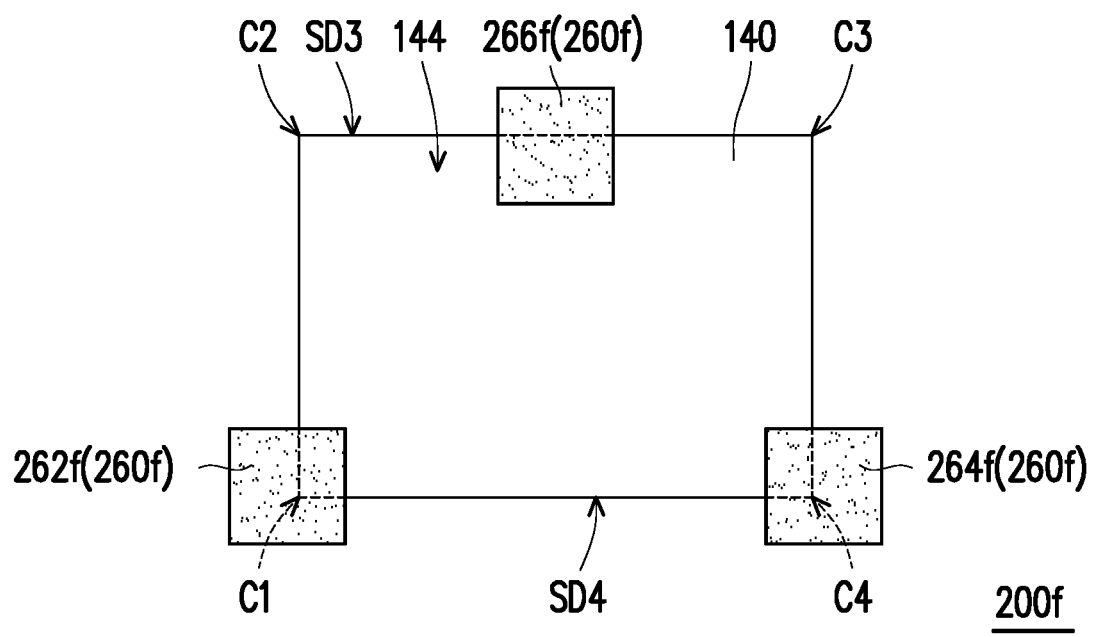

FIG. 2F is a schematic top view of a structure with micro light-emitting device according to another embodiment of the invention. Referring to both FIG. 2B and FIG. 2F, a structure with micro light-emitting device 200f of the embodiment is similar to the structure with micro light-emitting device 100g of FIG. 2B, and the difference therebetween is as follows: a holding structure 260f of the embodiment includes three sub-holding structures 262f, 264f, and 266f, and, when viewed from the top, the sub-holding structures 262f and 264f are disposed at the two corners C1 and C4 on the same edge SD4 of the second surface 144 of the micro light-emitting device 140, and the sub-holding structure 266f is disposed on the edge SD3 opposite to the edge SD4 of the micro light-emitting device 140. Here, a line connecting the sub-holding structures 262f, 264f, and 266f may form an isosceles triangle, but the invention is not limited thereto. In other embodiments not shown in the drawings, the line connecting the sub-holding structures may also form other types of triangles, e.g., an acute triangle, which still falls within the scope of the invention.

Figure 2G:
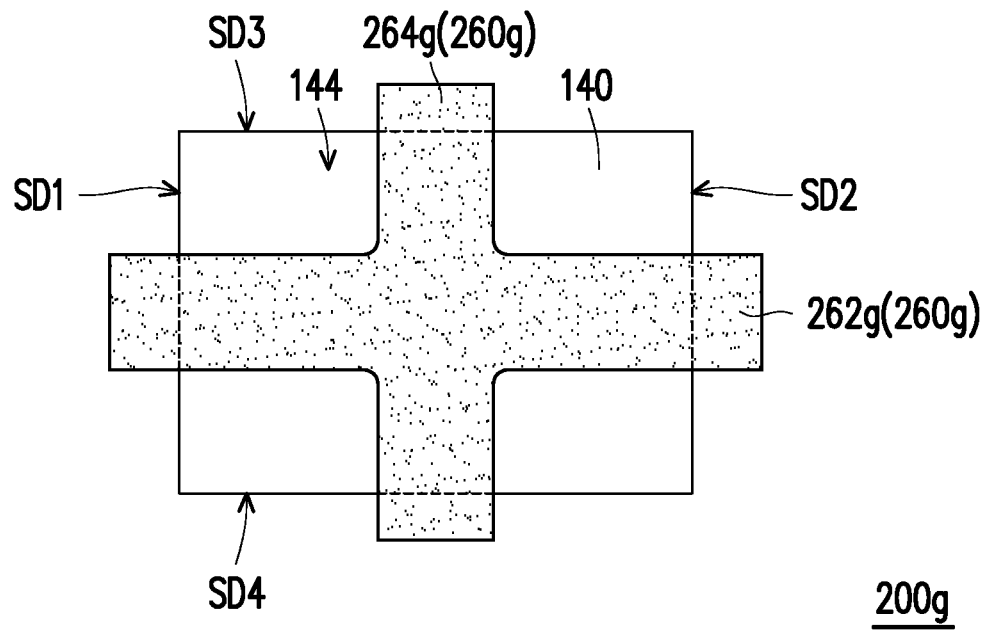

FIG. 2G is a schematic top view of a structure with micro light-emitting device according to another embodiment of the invention. Referring to both FIG. 2A and FIG. 2G, a structure with micro light-emitting device 200g of the embodiment is similar to the structure with micro light-emitting device 100a of FIG. 2A, and the difference therebetween is as follows: the number of a holding structure 260g of the embodiment is embodied as two, i.e., sub-holding structures 262g and 264g, and the sub-holding structures 262g and 264g are shaped as a cross when viewed from the top. The sub-holding structures 262g and 264g extend from the center of the second surface 144 of the micro light-emitting device 140 toward the four edges SD1, SD2, SD3, and SD4. Particularly, the sub-holding structure 262g extends between the edge SD1 and the edge SD2, and the sub-holding structure 264g extends between the edge SD3 and the edge SD4; however, the invention is not limited thereto.

Figure 2H:
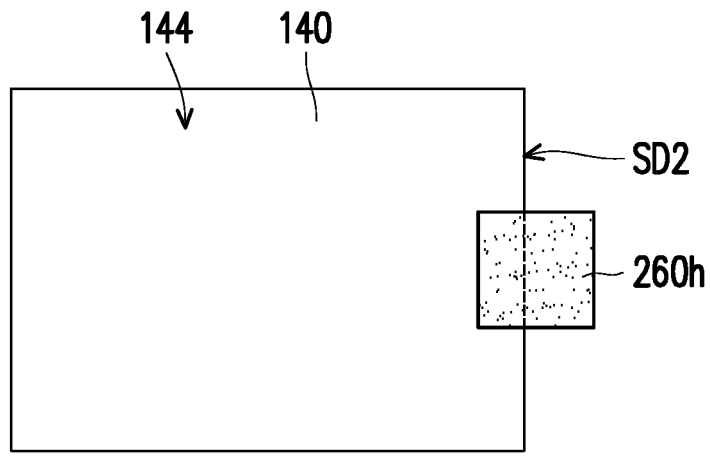

FIG. 2H is a schematic top view of a structure with micro light-emitting device according to another embodiment of the invention. Referring to both FIG. 2B and FIG. 2H, a structure with micro light-emitting device 200h of the embodiment is similar to the structure with micro light-emitting device 100g of FIG. 2B, and the difference therebetween is as follows: the number of a holding structure 260h of the embodiment is embodied as one. When viewed from the top, the holding structure 260h is disposed on the edge SD2 of the second surface 144 of the micro light-emitting device 140, but the invention is not limited thereto. In other embodiments not shown in the drawings, the holding structure may also be disposed on the other edges of the second surface of the micro light-emitting device, and such holding structure still falls within the scope of the invention.

Figure 2I:
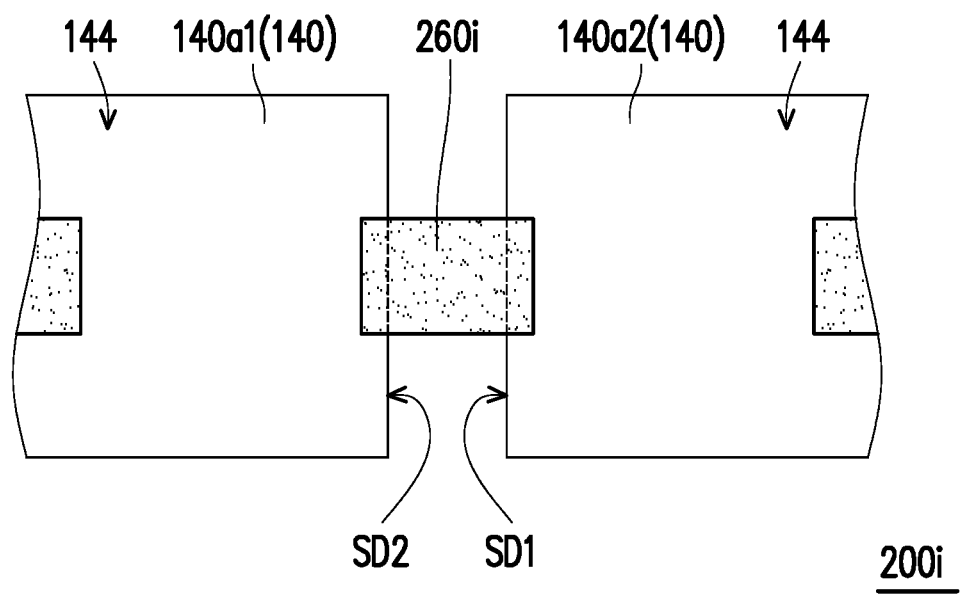
FIG. 2I is a schematic top view of a structure with micro light-emitting device according to another embodiment of the invention.

FIG. 2I is a schematic top view of a structure with micro light-emitting device according to another embodiment of the invention. Referring to both FIG. 2B and FIG. 2I, a structure with micro light-emitting device 200i of the embodiment is similar to the structure with micro light-emitting device 100g of FIG. 2B, and the difference therebetween is as follows: the micro light-emitting device 140 of the embodiment includes two micro light-emitting devices 140a1 and 140a2, and a holding structure 260i is located between the micro light-emitting devices 140a1 and 140a2. The holding structure 260i extends on the second surfaces 144 of the micro light-emitting devices 140a1 and 140a2 and directly contacts a portion of the edge SD2 of the micro light-emitting device 140a1 and a portion of the edge SD1 of the micro light-emitting device 140a2. That is to say, the micro light-emitting devices 140a1 and 140a2 may share the holding structure 260i to facilitate a simultaneous transport of the micro light-emitting devices between different temporary substrates and to save costs.

In some of the above-mentioned embodiments, one or two holding structures are schematically depicted as examples, but in other embodiments, the holding structure may include four or three sub-holding structures as depicted in FIG. 2E or FIG. 2F, but the invention is not limited thereto. In other embodiments not shown in the drawings, a shape of the holding structure may change according to an actual shape of the micro light-emitting device, and the holding structure may also include a plurality of holding structures depending on actual product requirements or in response to changes of product design, and the way to arrange the holding structure may also be adjusted based on the actual need, so that the micro light-emitting device supported by the holding structure may be easily transported.

Similarly, in the above-mentioned embodiments, one or two buffer structures are exemplarily depicted as examples, but in other embodiments not shown in the drawings, the buffer structure may include a plurality of buffer structures depending on an actual need, so that the holding structure that directly contacts the buffer structure may be protected by the buffer structure during the transportation of the structure with micro light-emitting device. In addition, in other embodiments not shown in the drawings, the micro light-emitting device 140, the holding structures 160a, 160d, 160f, 160g, 160h, 160i, 260c, 260d, 260e, 260f, 260g, 260h, and 260i, and the buffer structures 180a, 180b, 180d, 180e, 180f, 180g, and 180h in the above-mentioned embodiments may be used; thereby, the micro light-emitting device, the holding structure, and/or the buffer structure may contact with each other in a different manner, the micro light-emitting device may be temporarily fixed and held by more holding structures or less holding structures, or the holding structure(s) may be buffered by more buffer structures or less buffer structures. That is to say, the holding structure and the buffer structure may also be selectively connected to a top surface of the micro light-emitting device, a side surface thereof, a bottom surface thereof, or a combination thereof depending on the actual product requirements. As long as the holding structure directly contacts the buffer structure so as to well hold and support the holding structure when the micro light-emitting device is being transported and transferred, and as long as the buffer structure is able to well buffer the holding structure, the holding structure and buffer structure fall within the scope of the invention.

To sum up, in the structure with micro light-emitting device provided in an embodiment of the invention, the holding structure is disposed on the substrate and directly contacts the micro light-emitting device, and the buffer structure directly contacts the holding structure, wherein the Young's modulus of the buffer structure is smaller than the Young's modulus of the holding structure. Thereby, when the micro light-emitting device is being transported and transferred between different substrates, the holding structure may provide well hold and support the micro light-emitting device, and the buffer structure may well buffer the holding structure.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A structure with micro light-emitting device, comprising:
   a temporary substrate;
   at least one micro light-emitting device disposed on the temporary substrate, a vertical gap existing between the at least one micro light-emitting device and the temporary substrate, wherein the at least one micro light-emitting device has a first surface and a second surface opposite to each other, the first surface faces the temporary substrate, and the second surface is a light-emitting surface and is away from the temporary substrate;
   a holding structure disposed on the temporary substrate and directly contacting the at least one micro light-emitting device, wherein a material of the holding structure is an inorganic material; and
   at least one buffer structure directly contacting the holding structure, wherein a Young's modulus of the at least one buffer structure is smaller than a Young's modulus of the holding structure, an orthogonal projection of the at least one buffer structure on the temporary substrate does not overlap an orthogonal projection of the first surface of the at least one micro light-emitting device on the temporary substrate,
   wherein a gap is between the holding structure and the temporary substrate, the at least one buffer structure comprises a plurality of buffer structures located in the gap between the holding structure and the temporary substrate and directly contacting the temporary substrate and the holding structure, and the at least one micro light-emitting device, the buffer structures, and the temporary substrate define an air gap.

2. The structure with micro light-emitting device as recited in claim 1, wherein a maximum amount of deformation of the holding structure is less than the vertical gap between the at least one micro light-emitting device and the temporary substrate.

3. The structure with micro light-emitting device as recited in claim 1, wherein the at least one micro light-emitting device has a peripheral surface connecting the first surface and the second surface, and the holding structure extends toward the temporary substrate from the peripheral surface and is disposed on the temporary substrate.

4. The structure with micro light-emitting device as recited in claim 3, wherein the holding structure further extends onto at least a portion of the second surface of the at least one micro light-emitting device from the peripheral surface.

5. The structure with micro light-emitting device as recited in claim 4, wherein a ratio of a contact area of the holding structure and the second surface to a surface area of the second surface is within a range from 0.05 to 0.5.

6. The structure with micro light-emitting device as recited in claim 4, wherein the holding structure is successively arranged on the second surface of the at least one micro light-emitting device.

7. The structure with micro light-emitting device as recited in claim 4, wherein the holding structure exposes a portion of the second surface of the at least one micro light-emitting device.

8. The structure with micro light-emitting device as recited in claim 7, wherein a ratio of a first width of the holding structure arranged on the second surface of the at least one micro light-emitting device to a second width of the second surface of the at least one micro light-emitting device is within a range from 0.1 to 0.8.

9. The structure with micro light-emitting device as recited in claim 4, wherein a ratio of a width of the holding structure at an edge of the first surface of the at least one light-emitting device to a width of the edge of the first surface of the at least one light-emitting device is within a range from 0.05 to 0.6.

10. The structure with micro light-emitting device as recited in claim 3, wherein the holding structure directly contacts at least a portion of the peripheral surface.

11. The structure with micro light-emitting device as recited in claim 10, wherein a ratio of a contact area of the holding structure and the peripheral surface to a surface area of the peripheral surface is within a range from 0.05 to 0.5.

12. The structure with micro light-emitting device as recited in claim 1, wherein the buffer structures directly contact at least a portion of the peripheral surface or/and at least a portion of the first surface of the at least one micro light-emitting device.

13. The structure with micro light-emitting device as recited in claim 1, wherein the at least one micro light-emitting device comprises two micro light-emitting devices, and the holding structure is located between the micro light-emitting devices.

14. A structure with micro light-emitting device, comprising:
   a temporary substrate;
   at least one micro light-emitting device disposed on the temporary substrate, a vertical gap existing between the at least one micro light-emitting device and the temporary substrate, wherein the at least one micro light-emitting device is a flip-chip micro light-emitting device with a light-emitting surface away from the temporary substrate; and
   a holding structure disposed on and directly contacting the light-emitting surface of the at least one micro light-emitting device, wherein a material of the holding structure is an inorganic material, the holding structure extends toward the temporary substrate, is disposed on and directly contacts the temporary substrate.

15. The structure with micro light-emitting device as recited in claim 14, further comprising:
   at least one buffer structure disposed between the holding structure and the temporary substrate, wherein a Young's modulus of the at least one buffer structure is smaller than a Young's modulus of the holding structure.

16. The structure with micro light-emitting device as recited in claim 14, wherein the at least one micro light-emitting device has a peripheral surface, the holding structure directly contacts a portion of the peripheral surface.

* * * * *